US012178139B2

(12) United States Patent
Wallis et al.

(10) Patent No.: US 12,178,139 B2
(45) Date of Patent: Dec. 24, 2024

(54) METHOD OF PROVIDING AN AIR- AND/OR MOISTURE-BARRIER COATING ON A TWO-DIMENSIONAL MATERIAL

(71) Applicant: PARAGRAF LIMITED, Somersham (GB)

(72) Inventors: Robert Wallis, Somersham (GB); Hugh Glass, Somersham (GB); Martin Tyler, Somersham (GB); Simon Thomas, Somersham (GB); Ivor Guiney, Somersham (GB)

(73) Assignee: Paragraf Limited, Somersham (GB)

( * ) Notice: Subject to any disclaimer, the term of this patent is extended or adjusted under 35 U.S.C. 154(b) by 458 days.

(21) Appl. No.: 17/411,225

(22) Filed: Aug. 25, 2021

(65) Prior Publication Data
US 2022/0093852 A1 Mar. 24, 2022

(30) Foreign Application Priority Data

Sep. 18, 2020 (GB) ..................................... 2014761

(51) Int. Cl.
*H10N 52/01* (2023.01)
*H01L 21/02* (2006.01)
*H10N 52/00* (2023.01)
*H10N 52/80* (2023.01)

(52) U.S. Cl.
CPC ....... *H10N 52/01* (2023.02); *H01L 21/02527* (2013.01); *H01L 21/02554* (2013.01); *H01L 21/0257* (2013.01); *H10N 52/101* (2023.02); *H10N 52/80* (2023.02)

(58) Field of Classification Search
CPC ...... H10N 52/01; H10N 52/101; H10N 52/80; H01L 21/02527; H01L 21/02554; H01L 21/0257; H01L 21/02164; H01L 21/02222; H01L 21/02282; H01L 21/02326; H01L 21/041; H01L 21/0242; H01L 21/02573; H01L 21/02664; Y02P 70/50; C23C 18/1204; C23C 18/1216
See application file for complete search history.

(56) References Cited

U.S. PATENT DOCUMENTS 4,847,667 A * 7/1989 Mori ................... H01L 21/3105
365/185.32
6,391,779 B1 * 5/2002 Skrovan ............ H01L 21/32115
438/692

(Continued)

FOREIGN PATENT DOCUMENTS

GB 2585843 A 1/2021

*Primary Examiner* — Dale E Page
*Assistant Examiner* — Quovaunda Jefferson
(74) *Attorney, Agent, or Firm* — Stinson LLP

(57) ABSTRACT

Methods of providing an air- and/or moisture-barrier coating on at least a portion of a two-dimensional material are described. In particular, the methods provide an improved approach for providing a doped two-dimensional material, preferably graphene, on a substrate wherein at least a portion of the two-dimensional material is coated with an air- and/or moisture-barrier coating that comprises an inorganic oxide, fluoride or sulfide. Two-dimensional materials provided with an air- and/or moisture impermeable inorganic oxide, fluoride or sulfide coating and an electronic device comprising the same are also described.

22 Claims, 1 Drawing Sheet

(56) References Cited

U.S. PATENT DOCUMENTS

| | | | |
|---|---|---|---|
| 8,426,309 B2* | 4/2013 | Ward | H01L 29/1606 977/734 |
| 8,715,532 B2* | 5/2014 | Shin | B82Y 40/00 977/734 |
| 9,012,889 B2* | 4/2015 | Lee | H01L 21/228 257/29 |
| 2014/0158988 A1* | 6/2014 | Chen | H01L 29/78606 257/29 |
| 2017/0067970 A1* | 3/2017 | Polley | G01R 33/0041 |
| 2017/0082581 A1* | 3/2017 | Breuer | G01N 27/74 |

* cited by examiner

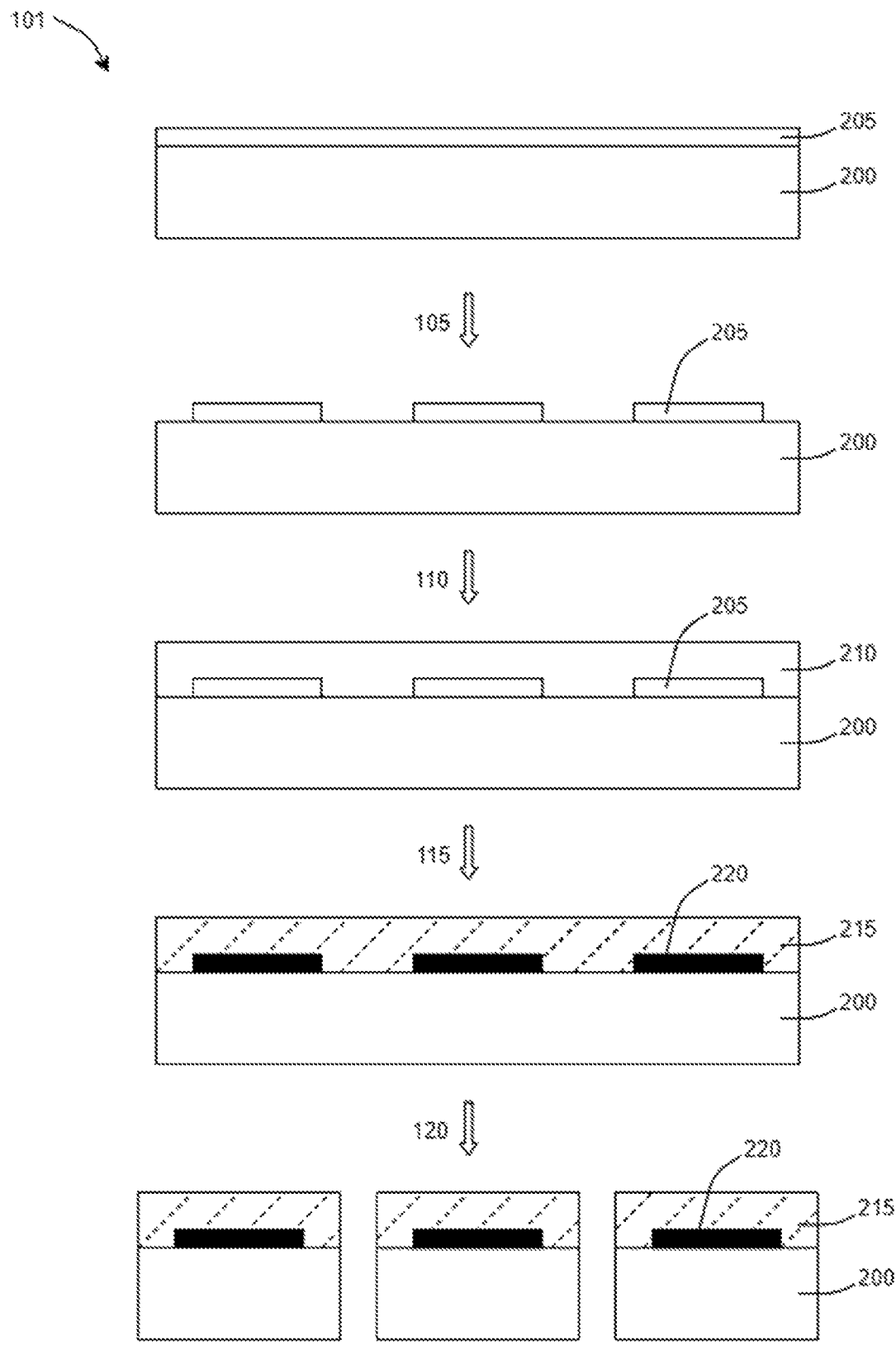

METHOD OF PROVIDING AN AIR- AND/OR MOISTURE-BARRIER COATING ON A TWO-DIMENSIONAL MATERIAL

REFERENCE TO RELATED APPLICATIONS

The present application claims the benefit of United Kingdom Application No. 2014761.7, filed Sep. 18, 2020, the entire contents of which is incorporated herein by reference.

FIELD OF THE INVENTION

The present invention relates to a method of providing an air- and/or moisture-barrier coating on at least a portion of a two-dimensional material. In particular, the method of the invention provides a novel and improved approach for providing a doped two-dimensional material (preferably graphene) on a substrate wherein at least a portion of the two-dimensional material is coated with an air- and/or moisture-barrier coating that comprises an inorganic oxide, fluoride or sulfide. Moreover, the present invention relates to a two-dimensional material provided with an air- and/or moisture impermeable inorganic oxide, fluoride or sulfide coating and an electronic device comprising the same.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, Volume 6, 183-191, March 2007 and in the focus issue of Nature Nanotechnology, Volume 9, Issue 10, October 2014.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors. Methods disclosed in WO 2017/029470 are preferably used to provide a two-dimensional material, such as a graphene layer structure, deposited on a substrate in the method disclosed herein.

Two-dimensional materials are being investigated for a range of potential applications, and in particular, graphene. Most notable is the use of graphene in electronic devices such as LEDs, photovoltaic cells, Hall-effect sensors, diodes and the like. Any reference herein with regards to graphene (a graphene layer structure) applies equally to other two-dimensional materials unless the context clearly dictates otherwise.

However, there remains a need for a method of producing a graphene layer structure having a protective air- and moisture-barrier coating. In particular, the performance and lifetime of an electronic device, such as a Hall sensor, can be significantly improved by having a barrier coating that protects the graphene layer structure from the air and moisture present in the atmosphere. Such a barrier also provides protection from contaminants that may adversely affect the graphene, such as through doping, which would otherwise alter the charge carrier density and/or charge carrier mobility of the graphene layer structure. Such contamination would alter the properties of the highly sensitive material leading to impaired function of the manufactured electronic device without such protection. There remains a need for a method that overcomes the problems associated with the contamination of graphene layer structures with unavoidable impurities that result in a change in the charge carrier density of the graphene layer structure.

GB 1910192.2 (GB 2585843 A) provides a method for the provision of coated graphene structures that results in a decrease in the charge carrier density of the graphene layer structure relative to the charge carrier density of the graphene layer structure as originally provided on a substrate. This is achieved by spin coating a composition comprising a polymer or polymer precursor onto a graphene layer structure so as to provide an air-impermeable coating wherein the graphene layer structure has a reduced charge carrier density.

US 2014/158988 A1 discloses a graphene transistor comprising a non-stoichiometric $TiO_x$ doping layer to dope the graphene layer.

It is known that organic electronics as well as electronics comprising two-dimensional materials may be sealed in macroscopic packaging made of glass or alumina and an epoxy used to seal the edges. However, over time, air and moisture is still able to permeate through the epoxy leading to the eventual degradation of the electronic device.

SUMMARY OF THE INVENTION

It is an object of the present invention to provide an improved method for producing a two-dimensional material, particularly a graphene layer structure, that overcomes, or substantially reduces, problems associated with the prior art or at least provides a commercially useful alternative.

Accordingly, in a first aspect there is provided a method of providing an air- and/or moisture-barrier coating on at least a portion of a two-dimensional material, the method comprising:

(i) providing a substrate having a two-dimensional material, preferably a graphene layer structure, thereon;
(ii) providing a composition comprising an inorganic oxide, fluoride or sulfide precursor and a doping agent;
(iii) coating the composition onto at least a portion of the two-dimensional material; and
(iv) curing and/or annealing the coated two-dimensional material at a temperature of no greater than 1200° C. to convert the inorganic oxide, fluoride or sulfide precursor into an inorganic oxide, fluoride or sulfide air- and/or moisture-barrier coating on at least a portion of the two-dimensional material and whereby the doping agent dopes the two-dimensional material.

BRIEF DESCRIPTION OF THE DRAWINGS

FIG. 1 illustrates an exemplary method of providing an air- and moisture-barrier coating on a graphene layer structure and shows cross-sections of the intermediate products and of the final coated graphene layer structure as described herein.

DETAILED DESCRIPTION

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The method provides an air- and/or moisture-barrier coating on at least a portion of a two-dimensional material. The air- and/or moisture-barrier coating is effective at preventing the ingress of air and/or moisture to the two-dimensional material. Such properties may be measured by conventional means known in the art. Air will be understood as that ambient atmosphere being a gaseous mixture consisting essentially of nitrogen and oxygen and moisture refers to water. Preferably, the air barrier is characterised by an oxygen transmission rate is less than $10^{-1}$ cm$^3$/m$^2$/day/atm, preferably less than $10^{-3}$ cm$^3$/m$^2$/day/atm and more preferably less than $10^{-5}$ cm$^3$/m$^2$/day/atm. Preferably, the moisture barrier is characterised by a water vapour transmission rate of less than $10^{-2}$ g/m$^2$/day, preferably less than $10^{-4}$ g/m$^2$/day, more preferably less than $10^{-5}$ g/m$^2$/day. Such transmission rates are generally accepted in the art as necessary for use in electronic devices such as LEDs wherein the more preferred transmission rates are necessary for OLEDs and organic photovoltaics. Due to such properties, the coating may also be referred to as an air- and/or moisture-impermeable coating and/or an air- and/or moisture-impermeable barrier coating. As will be appreciated, barrier coatings capable of achieving a low oxygen transmission rate typically provide a concomitant low water transmission rate and vice versa. Nevertheless, in certain embodiments and applications for the final electronic devices, it is simply necessary for the coating provide at least one of an air-barrier and a moisture-barrier.

It is most preferred that the two-dimensional material disclosed herein is graphene (a graphene layer structure). Other particularly preferred two-dimensional materials include mono-elemental two-dimensional materials such as silicene, germanene, borophene (whether doped or un-doped) though the method applies equally to two-dimensional materials such as h-BN and transition metal dichalcogenides (TMDCs) such as MoS$_2$, WS$_2$ and MoSe$_2$.

As used herein, graphene is described as a graphene layer structure. The term graphene layer structure means one or more layers of graphene stacked to form a coating of graphene on the substrate. The graphene layer structure may comprise from 1 to 100 layers, preferably from 1 to 50 layers, more preferably from 1 to 20 layers and most preferably from 1 to 10 layers. Preferably, the graphene layer structure comprises more than one layer of graphene, since this provides improved electrical properties to a final graphene-containing device (such as improved heat and electrical conductivity). In an alternatively preferred embodiment, the graphene layer structure comprises a single graphene layer so as to provide the unique and advantageous electronic properties associated with monolayer graphene (such as a substantially zero band gap).

The step of providing a substrate having a two-dimensional material, preferably graphene layer structure, thereon may be achieved by any method known in the art. Deposition of, for example, a graphene layer structure by VPE or MOCVD is particularly preferable, particularly where the substrate provides a non-metallic surface upon which the graphene layer structure is directly formed. MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials but would simply require the use of a carbon containing precursor for the production of graphene. Instead, the use of this term indicates to the person skilled in the art a general set of process and apparatus features. MOCVD is further distinct from CVD techniques by virtue of the system complexity and accuracy. While CVD techniques allow reactions to be performed with straightforward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. MOCVD is particularly preferred for achieving high quality two-dimensional materials such as graphene layer structures.

MOCVD can also be readily distinguished from atomic layer deposition (ALD) techniques. ALD relies on step-wise reactions of reagents with intervening flushing steps used to remove undesirable by products and/or excess reagents. It does not rely on decomposition or dissociation of the reagent in the gaseous phase. It is particularly unsuitable for the use of reagents with low vapour pressures such as silanes, which would take undue time to remove from the reaction chamber. MOCVD growth of graphene is discussed in WO 2017/029470. The method of WO 2017/029470 provides two-dimensional materials with a number of advantageous characteristics including: very good crystal quality; large material grain size; minimal material defects; large sheet size; and self-supporting.

The total thickness of the substrate is typically 50 to 1500 µm, preferably 400 µm to 1200 µm. However, thicker substrates also work and thick silicon wafers are up to 2 mm thick. The minimum thickness of the substrate is however determined in part by the substrate's mechanical properties and the maximum temperature at which the substrate is to be heated. The maximum area of the substrate is dictated by the size of the, preferably close coupled, reaction chamber. Preferably, the substrate has a diameter of at least 15 cm (6 inches), preferably 15 to 61 cm (6 to 24 inches) and more preferably 15 to 30 cm (6 to 12 inches). The substrate can be cut after growth to form individual devices using any known method.

Exemplary substrates that may be used in the method as described herein include silicon (Si), silicon carbide (SiC), silicon dioxide (SiO$_2$), sapphire (Al$_2$O$_3$) and III-V semiconductor substrates or combinations of two or more thereof. III-V semiconductor substrates may include binary III-V semiconductor substrates such as GaN and AlN and also tertiary, quaternary and higher order III-V semiconductor substrates such as InGaN, InGaAs, AlGaN, InGaAsP. Preferably, the graphene layer structure is provided on a substrate selected from silicon, silicon carbide, silicon dioxide, sapphire and III-V semiconductors. According to preferred embodiments, the substrate may be a light-emitting or light-sensitive device, such as an LED or a photovoltaic cell.

A particularly preferred substrate is sapphire, since this is electrically insulative and transparent. Moreover, it has a high thermal capacity allowing the graphene to be processed with a laser to form a Hall-effect sensor without damaging the graphene layer structure (as disclosed in GB 2570124).

It is preferred that the substrate provides a crystalline surface upon which the graphene is produced as ordered crystal lattice sites provide a regular array of nucleation sites that promote the formation of good graphene crystal overgrowth. The most preferred substrates provide a high density of nucleation sites. The regular repeatable crystal lattice of substrates used for semiconductor deposition is ideal, the atomic stepped surface offering diffusion barriers.

The growth chamber for forming the two-dimensional material preferably has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®. Other suitable growth chambers include Turbodisc K-series or Propel MOCVD systems available from Veeco Instruments Inc. Accordingly, in one particularly preferred embodiment, the step of providing a substrate having a two-dimensional material thereon comprises:

providing the substrate on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form the two-dimensional material on the substrate, wherein the inlets are cooled to less than 100° C., preferably from 50° C. to 60° C., and the susceptor is heated to a temperature of at least 50° C. in excess of a decomposition temperature of the precursor. As described herein, graphene is a particularly preferred two-dimensional material. In such an embodiment, the precursor compound is preferably a hydrocarbon. The precursor is preferably in the gas phase and/or suspended in a gas when passed over the heated substrate.

Preferably, the step of providing a substrate having a graphene layer structure deposited thereon comprises depositing graphene on a substrate and thereafter maintaining the substrate under a substantially inert atmosphere until the annealing step, preferably wherein the inert atmosphere consists of hydrogen, helium, argon, nitrogen or mixtures thereof, preferably argon or nitrogen.

The inventors have found that graphene, in particular the surface of graphene, is sensitive to a range of gases present in ambient air. The properties of graphene (such as electrical and optical properties) can be dramatically altered by the adsorption of atmospheric gases, in particular oxygen and water. The extent to which the adsorption of atmospheric gases have an effect on the properties of graphene layer structure may depend on factors such as the magnitude of doping. When exposed to air, graphene gradually undergoes a reaction that results in a change in carrier concentrations and reduced mobility.

Accordingly, the method as described herein preferably further comprises not exposing the graphene layer structure to an oxygen-containing atmosphere before spin coating the composition and/or the formation of the air- and/or moisture-barrier coating. Therefore, a graphene layer structure having a low carrier concentration may be achieved. The step of not exposing the graphene layer structure to an oxygen-containing atmosphere preferably comprises maintaining the graphene layer structure under an inert atmosphere. However, the step of not exposing the graphene layer structure to an oxygen-containing atmosphere may comprise minimising the exposure, such as less than 1 minute, less than 20 seconds or less than 10 seconds. This may be preferable so as to enable a simpler manufacturing process without having to ensure such a strict exclusion of contact with the atmosphere without substantially affecting the graphene properties due to the minimal exposure.

It is particularly preferred that where the method comprises not exposing the graphene layer structure to an oxygen-containing atmosphere, the method comprises providing a graphene layer structure on the substrate by VPE or MOCVD as described herein. Such a method allows for the direct formation of a graphene layer structure on a surface of a substrate within a reaction chamber without the need for further processing to provide graphene on a desirable substrate (i.e. one for use in electronic devices) for subsequent coating.

In contrast, graphene transfer processes, for example, may require etching of the metal substrate upon which graphene has been formed. Typical substrates include copper. The etching and transfer processes can have a detrimental effect on the quality of the graphene layer structure, the copper and etching solutions results in chemical modification of the surface of the graphene layer structure and such processes also take place in the presence of water and/or air.

A VPE or MOCVD reactor may itself be provided in an inert atmosphere (such as a glovebox) so as to enable the relevant steps of the method to be carried out under an atmosphere that is substantially free of air and moisture (in other words, one that has less than about 1000 ppm $O_2$ and less than about 1000 ppm $H_2O$, preferably less than about 500 ppm of each of $O_2$ and $H_2O$, even more preferably less than about 100 ppm).

The method comprises providing a composition comprising an inorganic oxide, fluoride or sulfide precursor and a doping agent. The composition comprises an inorganic oxide, fluoride or sulfide precursor, which will be understood to allow the formation of an air- and/or moisture-impermeable barrier coating upon curing and/or annealing. Inorganic oxide, fluoride and sulfide precursors have an appropriate degree of solubility in a solvent for use in spin coating so as to allow the formation of a coating of a desired thickness.

It will be understood that the inorganic oxide, fluoride or sulfide as described herein refers to a solid-state material that is an oxide, fluoride or sulfide of an inorganic element (i.e. an element other than carbon whose oxide, fluoride or sulfide is a solid under standard conditions). The precursor is typically one that provides a source of at least one inorganic element and which, upon heating, results in the formation of a solid state inorganic oxide, fluoride or sulfide. An inorganic oxide precursor may also react with an appropriate source of oxygen, preferably water and/or oxygen gas, to result in the formation of the inorganic oxide. Accordingly, the specific precursor and resulting inorganic oxide, fluoride or sulfide are not particularly limited. Nevertheless, preferable inorganic oxide coatings include aluminium oxide ($Al_2O_3$), silicon dioxide ($SiO_2$) and/or titanium dioxide ($TiO_2$). A preferable inorganic fluoride is magnesium fluoride and preferable sulfides include titanium disulphide, copper sulfide, zinc sulfide, tin sulfide and copper zinc tin sulfide (CZTS). By way of example, inorganic oxide precursors include perhydropolysilazane ($[H_2Si-NH]_n$) and/or polydimethylsiloxane ($[(CH_3)_2OSi]_n$) which result in the formation of silicon dioxide as the inorganic oxide. Alternatively, when the inorganic oxide is titanium oxide, the inorganic oxide precursor may be a titanium alkoxide, such as titanium ethoxide (Ti(OEt)$_4$). Similarly, inorganic alkoxides, such a silicon alkoxides and/or aluminium alkoxides, can be suitable inorganic oxide precursors for the inorganic oxide, such as for silicon dioxide and aluminium oxide. Inorganic sulfides such as CZTS can be formed from an inorganic sulfide precursor such as a mixture of copper chloride, zinc chloride, tin chloride and thiourea.

Preferably, the composition comprises from 5 wt % to 95 wt % of the inorganic oxide, fluoride or sulfide precursor based on the total weight of the composition, preferably from 10 wt % to 80 wt %. Such compositions may provide the desired level of precursor to enable the formation of a suitable inorganic oxide barrier, i.e. one that is not too thin and provides good barrier properties, and one that is not too thick which would unduly add thickness and weight to the coated graphene layer structure and ultimately any electronic device which comprises the coated graphene without any beneficial effect. Moreover, if the coating is too thick, not only does this increase the cost of manufacture due to the greater volumes of precursor used, the inventors have found that the coating can be susceptible to cracking. Accordingly, the thickness of the inorganic oxide, fluoride or sulfide air- and/or moisture-barrier coating is preferably from 1 nm to 1 μm, preferably from 2 nm to 500 nm and even more preferably from 5 nm to 250 nm.

The composition comprises a doping agent, which is preferably an organic doping agent. More preferably, the organic doping agent is a carboxylic acid and/or a conjugated hydrocarbon. The doping agent may be p-type doping agent or an n-type doping agent. Examples of p-type dopants include 7,7,8,8-tetracyanoquinodimethane (TCNQ), 2,3,5,6-tetrafluoro-7,7,8,8-tetracyanoquinodimethane (F$_4$TCNQ), phenyl-C61-butyric acid methyl ester (PCBM), bis(ethylenedithio)tetrathiafulvalene (BEDT-TTF) and NDI(CN)$_4$(tetracyano-napthalenediimide). Preferably, the doping agent is bis(ethylenedithio)tetrathiafulvalene, 1-pyrenemethylamine hydrochloride, 1-(bromomethyl)pyrene, tetracyanoquinodimethane or 2,3,5,6-tetrafluoro-tetracyanoquinodimethane or a combination thereof. In a most preferred embodiment, the composition comprises at least F$_4$TCNQ as the doping agent.

The amount of doping agent is not particularly limited provided that the doping agent is soluble in the solvent used and may be added in an amount sufficient to achieve the desired level of doping in the graphene layer structure. The composition preferably comprises from 1 ppm to 100000 ppm by weight of doping agent, preferably 5 ppm to 50000 ppm, even more preferably from 10 ppm to 10000 ppm.

The composition typically comprises a solvent. Common solvents include water, alcohols, ethers, ketones, esters, hydrocarbons and halocarbons including combinations thereof. It is preferred that the solvent for use in the method described herein is an organic solvent, preferably an ether, ketone, ester, hydrocarbon or halocarbon, ideally wherein the solvent does not contain hydroxyl groups. The particular solvent will typically be chosen having regard to the chemical reactivity of the inorganic oxide precursor. Low molecular weight solvents are particularly preferred since they have high vapour pressures and are volatile which makes them suitable for spin coating. Low molecular weight solvents may be considered as those having molecular weights of less than 1000, such as less than 500 and preferably less than 200. Ethers, such dialkyl ethers are preferred solvents with dibutyl ether being particularly preferred. In a preferred embodiment, the composition consists essentially of, and preferably consists of, the inorganic oxide, fluoride or sulfide precursor, doping agent and solvent.

The method comprises the step of coating the composition onto at least a portion of the two-dimensional material. Any coating method known in the art may be used coat the composition. The method preferably comprises spin coating the composition described herein onto at least a portion of the two-dimensional to form an air- and/or moisture impermeable coating. Spin coating is used to deposit thin films onto substantially flat surfaces such as the surface of a graphene layer structure. A known quantity of the composition is applied to the centre of the surface of the two-dimensional material whilst the substrate is not spinning or is spinning slowly. The substrate having the two-dimensional material and composition thereon is then spun at high speed in order to spread the coating composition by centrifugal force. Alternatively, an excess of the composition may be applied whilst spinning at high speeds until the desired thickness is achieved. Typically, rotation speeds may be greater than 1000 rpm (16.7 Hz), however, good film quality may be achieved at speeds greater than 500 rpm (8.3 Hz). Rotation speeds may be up to 12000 rpm (200 Hz).

Rotation is continued for a time sufficient to achieve a uniform spread of the composition across the surface of the two-dimensional material and is not particularly limited as thickness is varied primarily through selection of solvent and rotation speed. Rotation may be carried out for up to 2 minutes, such as approximately 1 minute.

The coating step is performed so as to cover at least a portion of the two-dimensional material. Accordingly, in some embodiments, a portion of the two-dimensional material may be left exposed. It is preferred that the composition is coated over substantially all of the surface of two-dimensional material, such as all of a graphene layer structure surface so as to fully encapsulate a graphene layer structure deposited on a substrate. Partial coating may be preferred where further processes are to be employed using the exposed two-dimensional material wherein at least part of the two-dimensional material is protected by the inorganic oxide, fluoride or sulfide barrier. Nevertheless, it may still be preferable to subsequently coat another composition (which may be same composition) onto at least a portion of the exposed two-dimensional material, preferably all of the exposed two-dimensional material, so as to fully encapsulate the two-dimensional material on the substrate.

The method as described herein comprises curing and/or annealing the spin-coated two-dimensional material at a temperature of no greater than 1200° C. This step converts the inorganic oxide, fluoride or sulfide precursor into an inorganic oxide, fluoride or sulfide air- and/or moisture-barrier coating on at least a portion of the two-dimensional material that has the composition deposited thereon. This step further results in the doping agent doping the two-dimensional material.

Preferably, the annealing step is carried out at a temperature no greater than 1000° C. Preferably, the annealing step is carried out for from 1 minute to 2 hours, preferably from 15 minutes to 1 hour. Preferably, the step is carried out for an amount of time sufficient to achieve complete conversion of the inorganic oxide, fluoride or sulfide precursor into an air- and/or moisture-barrier coating on the two-dimensional material.

The step of curing may comprise curing under radiation, preferably ultraviolet radiation. This may be particularly preferable in embodiments wherein the temperature of the process is maintained relatively low (such as less than 300° C., preferably less than 200° C.). Low temperatures may be preferable so as to protect the other components that may be present, such as the materials comprising the substrate or other materials deposited on the substrate, in manufacturing an electronic device. In one embodiment, the inorganic oxide, fluoride or sulfide precursor may be cured using ultraviolet radiation at ambient temperatures. Alternatively, a thermal cure and annealing process may comprise heating to a temperature of at least 200° C.

The step of annealing may preferably take place in the presence of moisture and/or oxygen. Moisture and/or oxygen are sources of oxygen atoms that may aid in the formation of the inorganic oxide from the inorganic oxide precursor.

The steps of coating followed by curing and/or annealing may be carried out multiple times so as to increase the thickness of the barrier coating in order to accurately achieve the desired thickness having the desired properties. This may be judged by the device performance over time. Different compositions may be sequentially coated so as to form different layers of inorganic oxide, fluoride or sulfide.

Whilst inorganic oxide, fluoride and sulfide layers such as those described herein can be deposited using vapour deposition techniques such as atomic layer deposition, these processes have the disadvantage of being relatively slow, costly, prone to defects if not well optimised, and challenging to scale up in volume. It is also not possible to introduce the doping agent as described herein which enables the tuning of the Fermi level of the graphene layer structure. Advantageously, this allows for a robust and stable, coated graphene layer structure on a substrate that may be used in electronic devices. Such a device therefore has a long service life and maintains excellent function throughout its life due to the reduced contamination of the graphene layer structure that would otherwise affect the carrier concentrations, carrier mobilities amongst other electronic properties.

The method as described herein allows for the sheet carrier concentration of the two-dimensional material prior to steps (i)-(iv) to be different to the sheet carrier concentration of the two-dimensional material having an air- and moisture-barrier coating thereon following steps (i)-(iv). During the step of curing and/or annealing the coated two-dimensional material, the presence of the doping agent in the composition, which is coated directly onto at least a portion of the two-dimensional material, will dope the two-dimensional material. Appropriate selection of the type of doping agent (n-type or p-type) and a desired concentration enables the formation of a doped two-dimensional material having altered sheet carrier concentrations and/or charge carrier mobilities.

Preferably, the air- and moisture-barrier coating consists essentially of, even more preferably consists of, inorganic oxide, fluoride or sulfide and doping agent. By carrying out the curing and/or annealing step as disclosed herein, and/or by simply providing a coated composition on the surface of the two-dimensional material, the doping agent is capable of chemically reacting with the two-dimensional material to thereby dope the two-dimensional material. It will be appreciated that, in the final product, the doping agent may be a charged species associated with the two-dimensional material as a result of having doped the two-dimensional material, however, it will also be appreciated that some doping agent may remain unreacted (and unaffected by the curing and/or annealing steps) in the barrier coating.

In a preferred embodiment of the present invention, a graphene layer structure is etched prior to spin coating and formation of the inorganic barrier using any technique known in the art. Suitable etching processes include laser etching and standard photolithography techniques; such processes may use a mask to facilitate definition of a Hall sensor portion. Preferably, the two-dimensional material is processed by etching to form a Hall sensor (Hall effect sensor) before the step of coating. In one preferred embodiment, the method comprises laser etching a graphene layer structure to form a Hall sensor portion. The method described herein preferably further comprises forming contacts on the Hall sensor prior to coating so as to enable the Hall sensor to be connected to other devices and systems. Any method of forming contacts known in the art may be used. Examples of suitable contacts include Ti/Au, Cr/Au, Ni/Al which may be formed by methods such as electron beam deposition, thermal evaporation or sputtering.

A Hall sensor is a well-known component in the art. It is a transducer that varies its output voltage in response to a magnetic field. Hall sensors are used for proximity switching, positioning, speed detection, and current sensing applications. In a Hall sensor, a thin strip of a conductor has a current applied along it, in the presence of a magnetic field the electrons are deflected towards one edge of the conductor strip, producing a voltage gradient across the short side of the strip (perpendicular to the feed current). In contrast to inductive sensors, Hall sensors have the advantage that they can detect static (non-changing) magnetic fields.

The inventors have found that a Hall sensor provided with a graphene layer structure, particularly a single graphene monolayer, and coated using the method described herein, provides a particularly efficient and sensitive sensor for this purpose. Surprisingly, an effect of a composition as described herein on the two-dimensional material is the ability to reduce the density of the charge carriers throughout the graphene layers of the graphene layer structure through the use of the doping agent.

The concentration of the doping agent in the composition may be selected to counteract the intrinsic doping level of the two-dimensional material, thereby reducing the number of charge carriers in the coated two-dimensional material relative to the freshly prepared and exposed two-dimensional material. The coated two-dimensional material may have a charge carrier density that has been reduced as a result of the method described herein. In a preferred embodiment, the charge carrier density of a coated graphene layer structure is less than $5 \times 10^{12}$ cm$^{-2}$ and more preferably less than $1 \times 10^{12}$ cm$^{-2}$. It may be preferable for the charge carrier density is as low as possible though $5 \times 10^{10}$ cm$^{-2}$ is approaching the theoretical lower limit. Accordingly, for practical considerations, the charge carrier density may preferably be from $5 \times 10^{10}$ cm$^{-2}$ to $1 \times 10^{12}$ cm$^{-2}$ such as from $1 \times 10^{11}$ to $1 \times 10^{12}$ cm$^{-2}$. A coated graphene layer structure formed by the method as described herein may advantageously have a lower carrier concentration than the initial graphene layer structure along with increased mobility.

In accordance with another aspect, there is provided a doped two-dimensional material obtainable by the method described herein. In accordance with the method disclosed herein, a doped graphene layer structure obtainable by such a method is particularly preferred.

In accordance with a further aspect, there is also provided a doped two-dimensional material on a substrate wherein at least a portion of the two-dimensional material, preferably substantially all of the two-dimensional material, is coated with an air- and/or moisture-barrier coating comprising an inorganic oxide, fluoride or sulfide. As discussed with respect to the other aspects, the (doped) two-dimensional material is preferably a (doped) graphene layer structure. That is, preferably the doped two-dimensional material on a substrate is a doped graphene layer structure on a substrate wherein substantially all of the graphene layer structure is coated with an air- and/or moisture-barrier coating comprising an inorganic oxide, fluoride or sulfide. Preferably, the coating further comprises an organic doping agent as described herein. It is also preferred that the graphene layer structure has a charge carrier density of less than $5 \times 10^{12}$ $cm^{-2}$.

According to another aspect, there is provided an electronic device comprising the doped two-dimensional material as described herein. In a particularly preferred embodiment, the electronic device is a Hall sensor, preferably a graphene Hall sensor wherein the two-dimensional material is a graphene layer structure. Having the coating coat substantially all of the graphene layer structure is particularly advantageous for Hall sensors so as to maintain such low charge carrier densities by protecting the graphene from atmospheric contamination.

The present invention will now be described further with reference to the following non-limiting FIGURE, in which FIG. 1 illustrates an exemplary method of providing an air- and moisture-barrier coating on a graphene layer structure and shows cross-sections of the intermediate products and of the final coated graphene layer structure as described herein.

FIG. 1 illustrates a method 101 of providing an air- and moisture-barrier coating 215 on a graphene layer structure 205. The method 101 comprises providing a substrate 200 having a graphene layer structure 205 thereon. For example, this may be a 6 inch (15 cm) silicon substrate having a uniform graphene monolayer grown directly thereon by the method described herein.

The method 101 further comprises a step 105 of etching the graphene layer structure with a laser to provide a plurality of graphene portions. Etching step 105 takes place before step 110 of spin-coating a composition comprising an inorganic oxide, fluoride or sulfide precursor and a doping agent on at least a portion of the etched graphene layer structure 205 to form a coating 210 of the composition. As illustrated in FIG. 1, preferably the composition is coated across the entire surface of the graphene layer structure.

The method 101 further comprises a step 115 of annealing the coated graphene layer structure (i.e. the substrate 200, etched graphene layer structure 205 and coated composition 210) at a temperature of 1000° C. to convert the inorganic oxide, fluoride or sulfide precursor into the inorganic oxide, fluoride or sulfide air- and moisture-barrier coating 215. Step 115 further results in the doping of the etched graphene layer structure 205 by the doping agent in the composition to produce doped graphene layer structures 220.

The method 101 further comprises a step 120 of cleaving the substrate and coating to provide a plurality of the final coated and doped graphene layer structure products.

As will be readily appreciated, the substrate may be cleaved prior to spin coating and the method steps carried out on the smaller patterned graphene layer structures which are provided individually on cleaved substrates.

For the production of a graphene Hall sensor, the method preferably comprises a step of forming contacts on the graphene layer structure between steps 105 of etching the graphene layer structure and step 110 of spin coating a composition.

EXAMPLES

Example 1

A graphene layer structure is grown directly on a sapphire substrate and a laser used to etch the graphene into a Hall sensor. Contacts are subsequently deposited thereon. A suitable dopant such as $F_4TCNQ$ is dissolved into a solution of 18.5 wt % perhydropolysilazane in dibutyl ether and spin-coated at 1000 rpm (16.7 Hz) onto the etched graphene layer structure. The sample is pre-baked on a hotplate at 150° C. for 3 minutes and subseqently annealed at 1000° C. for 30 minutes to result in conversion of the inorganic oxide precursor into $SiO_2$ with concomitant doping of the graphene layer structure. Alternatively, the spin-coated graphene on the substrate may be submerged in water (or hydrogen peroxide or ammonium hydroxide, for example) at between room temperature and 80° C. for between 10 and 60 minutes for conversion of the inorganic oxide precursor.

Comparative Example 1 (Thermal Curing of Perhydropolysilazane)

A graphene layer structure is grown directly on a sapphire substrate. The graphene coated substrate is cleaved into 10 mm×10 mm samples. Durazane 2850 (perhydropolysilazane) is spin coated onto the surface of the graphene layer structure at 1000 rpm (16.7 Hz) for 60 seconds. The sample is pre-baked on a hotplate for 10 minutes at 100° C. The pre-baked sample is then cured on a hotplate for 1 to 10 minutes. The cured sample is then annealed at between 800 and 1000° C. for 30 minutes to convert the inorganic oxide precursor into $SiO_x$. The sample is removed and left to cool for >20 minutes.

Comparative Example 2 (UV Curing of Perhydropolysilazane)

A graphene layer structure is grown directly on a sapphire substrate. The graphene coated substrate is cleaved into 10 mm×10 mm samples. Durazane 2850 (perhydropolysilazane) is spin coated onto the surface of the graphene layer structure at 1000 rpm (16.7 Hz) for 60 seconds. The sample is pre-baked on a hotplate for 10 minutes at 100° C. The pre-baked sample is then cured on hotplate for 1 minute at 250° C. The cured sample is then transferred to a UV chamber housing a 172 nm Xe excimer lamp, positioned at a distance of 2 cm from the lamp and the sample exposed for 20 minutes to convert the inorganic oxide precursor into $SiO_x$.

Comparative Example 3 (Hydrogen Peroxide Curing of Perhydropolysilazane)

A graphene layer structure is grown directly on a sapphire substrate. The graphene coated substrate is cleaved into 10 mm×10 mm samples. Durazane 2850 (perhydropolysilazane) is spin coated onto the surface of the graphene layer structure at 6000 rpm (100 Hz) for 60 seconds. The sample is pre-baked on a hotplate at 150° C. for 3 minutes. The pre-baked sample is then submerged for 10 minutes in room temperature 30 vol % hydrogen peroxide to convert the inorganic oxide precursor into $SiO_x$. The cured sample is removed and blown dry with nitrogen gas.

Comparative Example 4 (UV Surface Modification of Polydimethylsiloxane into $SiO_2$)

A graphene layer structure is grown directly on a sapphire substrate. The graphene coated substrate is cleaved into 15 mm×15 mm samples. A solution of UV curable polydimethylsiloxane (PDMS) (150 mg) is prepared by diluting with decamethylcyclopentasiloxane (60 mg). The solution is spin-coated onto the sample at 6000 rpm (100 Hz) for 60 seconds. The spin-coated sample is then exposed to 254 nm UV radiation for 15 minutes to cure the PDMS. The cured sample is then transferred to a UV chamber housing a 172 nm Xe excimer lamp, positioned at a distance of 2 cm from the lamp and the sample exposed for 20 minutes to convert the inorganic oxide precursor into $SiO_x$.

All percentages herein are by weight unless otherwise stated.

As used herein, the singular form of "a", "an" and "the" include plural references unless the context clearly dictates otherwise. The use of the term "comprising" intended to be interpreted as including such features but not (necessarily) limited to is also intended to include the option of the features necessarily being limited to those described. In other words, the term also includes the limitations of "consisting essentially of" (intended to mean that specific further components can be present provided they do not materially affect the essential characteristic of the described feature) and "consisting of" (intended to mean that no other feature may be included such that if the components were expressed as percentages by their proportions, these would add up to 100%, whilst accounting for any unavoidable impurities), unless the context clearly dictates otherwise. It will be understood that the term "on" is intended to mean "directly on" such that there are no intervening layers between one material being said to be "on" another material.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method of providing an air- and/or moisture-barrier coating on at least a portion of a two-dimensional material, the method comprising:
    (i) providing a substrate having a two-dimensional material thereon;
    (ii) providing a composition comprising an inorganic oxide, fluoride or sulfide precursor and a doping agent;
    (iii) coating the composition onto at least a portion of the two-dimensional material; and
    (iv) curing and/or annealing the coated two-dimensional material at a temperature of no greater than 1200° C. to convert the inorganic oxide, fluoride or sulfide precursor into an inorganic oxide, fluoride or sulfide air- and/or moisture-barrier coating on at least a portion of the two-dimensional material and whereby the doping agent dopes the two-dimensional material.

2. The method according to claim 1, wherein the doping agent is a carboxylic acid and/or a conjugated hydrocarbon.

3. The method according to claim 1, wherein the composition comprises from 1 ppm to 100000 ppm by weight of doping agent.

4. The method according to claim 1, wherein the composition comprises an organic solvent.

5. The method according to claim 1, wherein the composition comprises an inorganic oxide precursor and either the inorganic oxide is silicon dioxide, optionally wherein the inorganic oxide precursor is perhydropolysilazane and/or polydimethylsiloxane or the inorganic oxide is titanium oxide, optionally wherein the inorganic oxide precursor is titanium ethoxide.

6. The method according to claim 1, wherein the composition comprises from 5 wt % to 95 wt % of the inorganic oxide, fluoride or sulfide precursor based on the total weight of the composition.

7. The method according to claim 1, wherein the annealing step is carried out at a temperature no greater than 1000° C.

8. The method according to claim 1, wherein the annealing step is carried out for from 1 minute to 2 hours.

9. The method according to claim 1, wherein the composition comprises an inorganic oxide precursor and the step of annealing takes place in the presence of moisture and/or oxygen.

10. The method according to claim 1, wherein the step of providing a substrate having a two-dimensional material deposited thereon comprises depositing the two-dimensional material on a substrate and thereafter maintaining the substrate under a substantially inert atmosphere until the annealing step.

11. The method according to claim 1, further comprising etching the two-dimensional material prior to the step of coating the composition onto at least a portion of the two-dimensional material.

12. The method according to claim 11, wherein etching forms a Hall sensor and the method further comprises forming contacts on the Hall sensor prior to the step of coating.

13. The method according to claim 1, wherein the step of coating the composition onto at least a portion of the two-dimensional material comprises spin coating the composition.

14. The method according to claim 1, wherein the substrate is an insulator or semiconductor material.

15. The method according to claim 1, wherein the thickness of the inorganic oxide fluoride or sulfide air- and/or moisture-barrier coating is from 1 nm to 1 μm.

16. The method according to claim 1, wherein the coating has an oxygen transmission rate of less than $10^{-1}$ $cm^3/m^2/day/atm$ and/or wherein the coating has a water vapour transmission rate of less than $10^{-2}$ $g/m^2/day$.

17. The method according to claim 1, wherein the sheet carrier concentration of the two-dimensional material prior to steps (i)-(iv) is different to the sheet carrier concentration of the two-dimensional material having an air- and/or moisture-barrier coating thereon following steps (i)-(iv).

18. The method according to claim 1, wherein the two-dimensional material comprises a graphene layer structure.

19. The method according to claim 1, wherein the inorganic oxide is selected from aluminium oxide, silicon dioxide and/or titanium dioxide, the inorganic fluoride is magnesium fluoride, and the inorganic sulfide is selected from titanium sulfide, copper sulfide, zinc sulfide, tin sulfide and copper zinc tin sulfide.

20. A doped two-dimensional material on a substrate wherein at least a portion of the two-dimensional material is coated with an air- and/or moisture-barrier coating comprising an inorganic oxide, fluoride or sulfide and a doping agent; and wherein the two-dimensional material has a charge carrier density of less than $5 \times 10^{12}$ $cm^{-2}$.

21. An electronic device comprising the doped two-dimensional material according to claim 20.

22. An electronic device according to claim 21, wherein the electronic device is a Hall sensor.

* * * * *